United States Patent
Cox et al.

(10) Patent No.: US 10,692,560 B2
(45) Date of Patent: Jun. 23, 2020

(54) PERIODIC CALIBRATIONS DURING MEMORY DEVICE SELF REFRESH

(71) Applicant: Intel Corporation, Santa Clara, CA (US)

(72) Inventors: Christopher E. Cox, Placerville, CA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/001,869

(22) Filed: Jun. 6, 2018

(65) Prior Publication Data

US 2019/0043557 A1    Feb. 7, 2019

(51) Int. Cl.
| | |
|---|---|
| G11C 11/40 | (2006.01) |
| G11C 11/406 | (2006.01) |
| G11C 7/10 | (2006.01) |
| G06F 3/06 | (2006.01) |
| G11C 11/4093 | (2006.01) |
| G11C 29/02 | (2006.01) |

(52) U.S. Cl.
CPC ...... *G11C 11/40615* (2013.01); *G06F 3/0659* (2013.01); *G11C 7/10* (2013.01); *G11C 7/1057* (2013.01); *G11C 11/4093* (2013.01); *G11C 29/021* (2013.01); *G11C 29/022* (2013.01); *G11C 29/028* (2013.01); *G11C 29/023* (2013.01); *G11C 2207/2254* (2013.01)

(58) Field of Classification Search
CPC ............ G11C 11/40615; G11C 29/028; G11C 29/022; G11C 29/021; G11C 7/1057; G11C 11/4093; G11C 7/10; G11C 29/023; G11C 2207/2254

See application file for complete search history.

(56) References Cited

U.S. PATENT DOCUMENTS

| | | | |
|---|---|---|---|
| 2007/0007992 A1* | 1/2007 | Bains ................... | G11C 7/1051 326/30 |
| 2014/0192583 A1* | 7/2014 | Rajan ...................... | G11C 7/10 365/63 |
| 2017/0052722 A1* | 2/2017 | Ware ................... | G06F 13/1636 |

* cited by examiner

*Primary Examiner* — Mohammed A Bashar
(74) *Attorney, Agent, or Firm* — Compass IP Law PC

(57) ABSTRACT

A memory device is described. The memory device includes logic circuitry to perform calibrations of resistive network terminations and data drivers of the memory device while the memory device is within a self refresh mode.

16 Claims, 5 Drawing Sheets

PERIODIC CALIBRATIONS DURING MEMORY DEVICE SELF REFRESH

FIELD OF INVENTION

The field of invention pertains to the electronic arts, and, more specifically to periodic calibrations during memory device self refresh.

BACKGROUND

Computing systems typically include memory devices that can be placed into a self refresh mode during periods when the memory devices are not actively performing read or write operations. Ideally, when the memory devices need to transition back to active mode from self refresh mode, they can do so quickly so that the computing system does not have to wait for extended periods of time before read or write commands can be sent to the memory devices.

FIGURES

A better understanding of the present invention can be obtained from the following detailed description in conjunction with the following drawings, in which.

DETAILED DESCRIPTION

Figure 1:
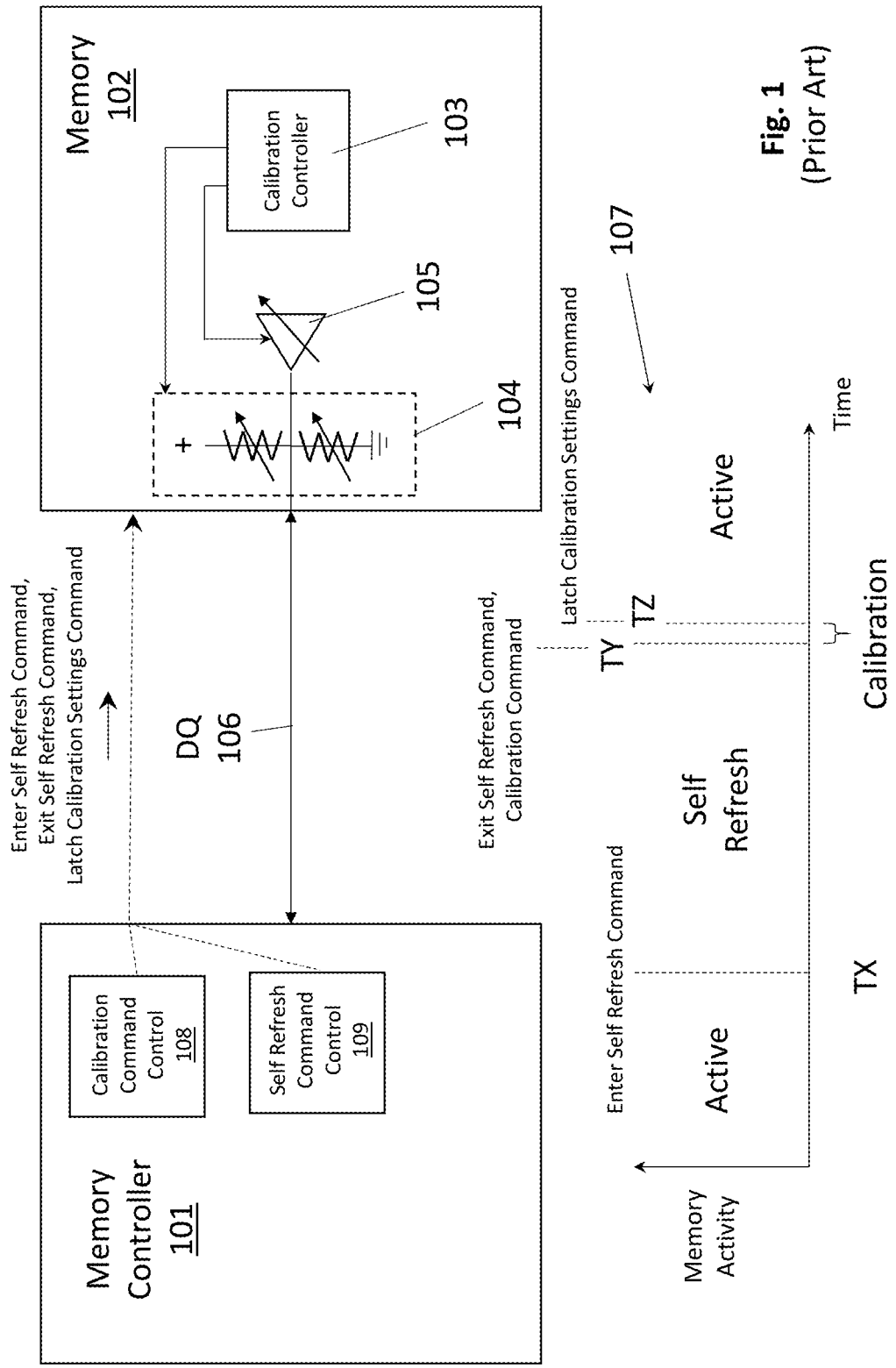
FIG. 1 shows a prior art memory controller and memory device.

FIG. 1 shows a prior art memory subsystem that includes a host side memory controller 101 and a memory device 102. The memory device 102 may be one of a number of memory chips that are disposed on a dual in-line memory module (DIMM) (which is not shown in FIG. 1 for illustrative ease). The DIMM may be plugged into a memory channel that is coupled to the memory controller 101. The memory channel may be a dual data rate (DDR) memory channel having characteristics that are defined by a Joint Electron Device Engineering Council (JEDEC) industry standard (e.g., a JEDEC DDR4 memory channel).

The memory device 102 is coupled to the memory controller 101 by a DQ wire 106. The DQ wire 106 is a bi-directional data wire that transfers write information from the memory controller 101 to the memory device 102 during a write operation and transfers read information from the memory device 102 to the memory controller 101 during a read operation. For simplicity, only the single DO wire 106 is depicted between the memory controller 101 and the memory device 102. In practice, however, a plurality of DQ wires exist between the memory controller 101 and the memory device to effect a data bus having some bit width (e.g., sixty four DQ wires form a 64 bit data bus between the memory controller 101 and the memory device 102). Additional command and/or addressing signal wires (e.g., a command address (CA) bus) also exist between the memory controller 101 and the memory device 102 so that the memory controller can send commands and addresses to the memory device 102.

The end point of the DQ wire 106 within the memory device 102 includes a termination resistance network 104 and a data driver 105. The resistance network 104 provides termination resistance at the end of the DQ wire 106 for write data signals sent from the memory controller 101 to the memory device 102 during a write operation. The resistance of the termination network 105, ideally, prevents or otherwise diminishes reflections of the write data signals at the DQ wire/memory device interface. The driver 105 has a source impedance and/or drive current strength that, ideally, drives read data from the memory device 102 onto the DQ wire that is adequately received by the memory controller 101 during a read operation.

Both the resistance of the termination network 104 and the source impedance and/or current drive strength of the driver 105 are designed to be variable so that they can be calibrated by a calibration controller 103 (e.g., a JEDEC specified "ZQ" calibration) during the memory device's operation. Here, the correct resistance of the termination network 104 and the correct source impedance and/or current drive strength of the driver 105 can be a function of temperature and/or supply voltage. Importantly, these parameters can change over the course of operation of the memory device 102. As such, the correct settings for the termination network 104 and driver 105 can likewise change over the course of operation of the memory device 102.

When the memory controller 101 determines that it is appropriate for the memory device to calibrate its DQ termination resistance networks and/or its DQ drivers, it sends a command to the memory device 102 to perform the calibration. The command is ultimately received by a calibration controller 103 within the memory device 102 that is responsible for executing the calibration routines that determine the correct termination network and driver settings. Unfortunately, however, the execution of the calibration routines consumes a non-negligible amount of time that impacts the performance of the memory subsystem.

Inset 107 shows a particular exposure to memory subsystem performance. Here, in the case where the memory device 102 is a dynamic random access memory (DRAM) memory device, the storage cells of the memory device 102 need to be periodically refreshed in order to preserve their data. Here, if the memory controller 101 recognizes that the memory device 102 (or the memory device's DIMM, or the channel that the memory device's DIMM is plugged into) is undergoing and/or about to undergo an extended time period of inactivity (no read or write commands), the memory controller 101 commands the memory device 102 to enter a self refresh mode.

In response, the memory device 102 applies refreshing signals to its internal storage cells so that they preserve their data. As depicted in the timing diagram of inset 107, the memory device is active up to time TX at which point it will not be used for an extended period of time going forward and is placed into self refresh mode by the memory controller 101. At time TY, the memory device needs to be used again.

The memory controller 101 therefore commands the memory device 102 to exit self refresh mode and perform a calibration of its DQ resistive termination networks and drivers (because the temperature and supply voltages may have changed since the earlier time (at TX) when the memory device 102 initially entered the self refresh mode). Upon the memory device 102 confirming that the calibration was successfully performed (by setting a flag in its mode register space that the memory controller 101 subsequently reads), the memory controller 101 commands the memory device 102 to latch the newly determined calibration settings as the formal termination network and driver settings of the memory device. Unfortunately, the lengthy amount of time consumed performing the calibration (e.g., 1-6 µs) dramatically delays the time at which the memory device 102 is able to re-enter active mode (TZ) from the moment the decision is made (TY) to transition the device 102 from self-refresh mode to active mode.

This extensive delay (TZ-TY) negatively impacts the performance of the overall memory subsystem from the perspective of the various system components that use it (e.g., CPU cores, GPU cores, display driver, networking interface, non volatile mass storage, etc.). In particular, the advantage of the memory controller 101 being able to opportunistically enter the memory device 102 into self refresh mode (e.g., if the memory controller 101 recognizes an upcoming time period of read/write inactivity of the memory device 102), e.g., for modest periods of time in between active time periods (e.g., tens or hundreds of micro-seconds), is greatly diminished if too much time is consumed performing the calibration when transitioning back to active mode.

Figure 2:
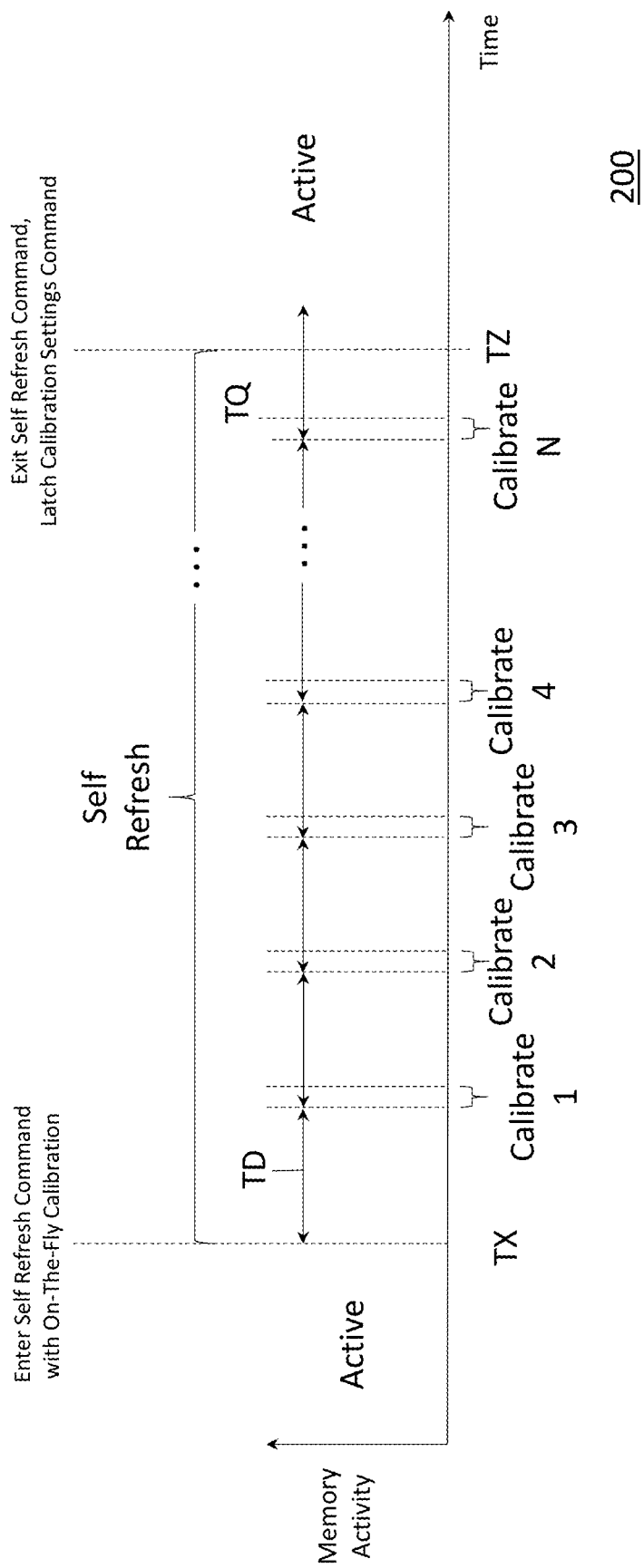
FIG. 2 shows an improved memory device self refreshing sequence.

FIG. 2 shows a solution in which, rather than wait until an affirmative decision is made to transition the memory 202 from self refresh mode to active mode before recalibrating the DQ wires, the memory device 202 periodically recalibrates the DQ resistive network and driver settings during its self refresh mode. As observed in FIG. 2, the memory device 202 is configured to recalibrate the resistive network termination and driver settings every TD. That is, as observed in FIG. 2, a first calibration 1 occurs TD after the memory device first enters self refresh at time TX. A second calibration 2 occurs TD after the first calibration 1, a third calibration 3 occurs TD after the second calibration 2, a fourth calibration 4 occurs TD after the third calibration, etc.

The periodic calibrations continue until the memory device receives a command from the memory controller to exit out of self refresh mode (TZ). Notably, N calibrations were performed over the time length of the self refresh mode. Here, the temperate and supply voltages of the memory subsystem are presumed to not have changed much since the Nth calibration was completed (TQ). As such, the resistance termination network and driver settings that where established at the Nth calibration are presumed to be sufficient for the temperature and supply voltage conditions that exist when the command to exit from self refresh mode is received at time TZ.

As described in more detail further below, in various embodiments, the memory controller 201 also confirms that the most recent calibration sequence (the Nth sequence) was successful (e.g., by reading the state of a flag is set in the memory device's mode register space) and, if so, commands the memory device to latch the settings from the Nth calibration sequence as the memory device's formal resistive network termination and driver settings. After the settings have been latched, the memory device enters the active mode and can receive read/write commands from the memory controller. As such, the memory device 202 is able to transition from the self refresh mode to the active mode approximately at time TZ without performing a calibration.

Figure 3:
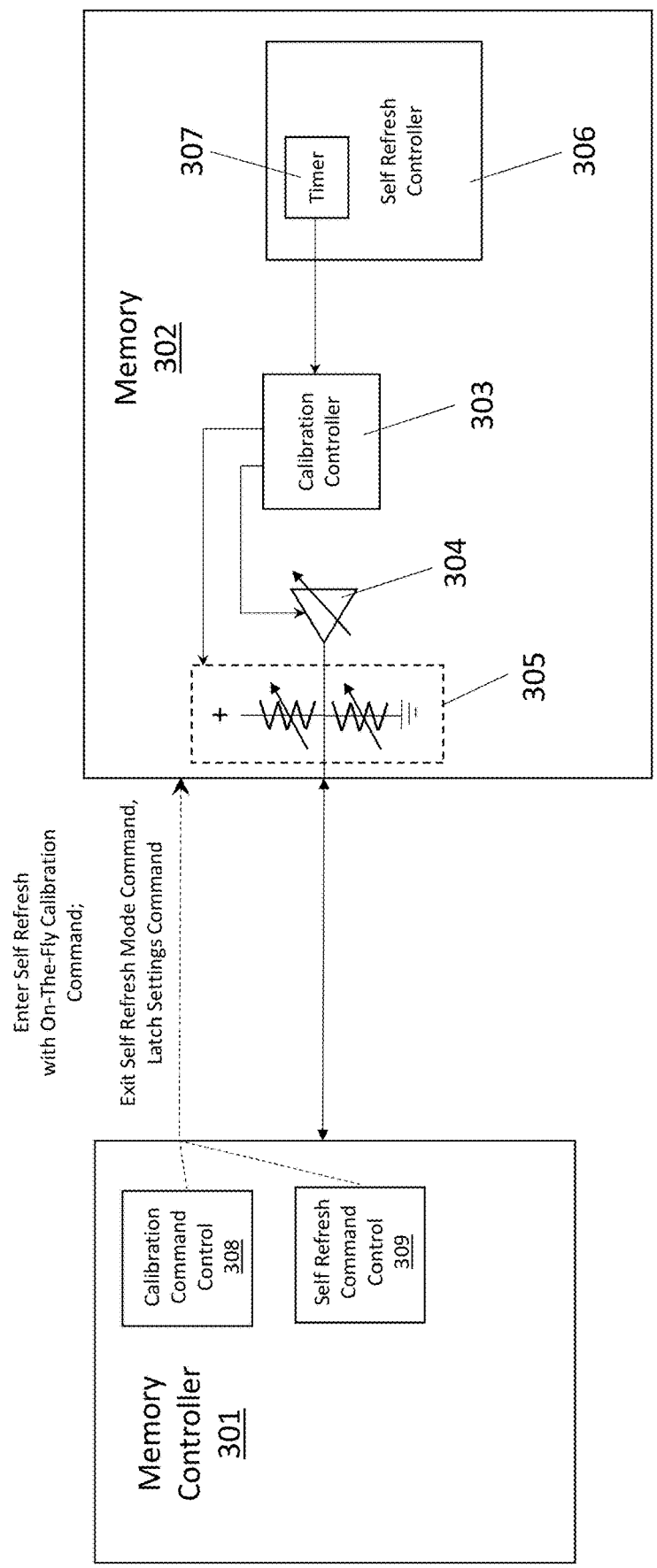
FIG. 3 shows an improved memory controller and memory device for implementing the improved memory device self refreshing sequence of FIG. 2.

FIG. 3 shows an improved memory controller 301 and memory device 302 that together can implement the improved approach of FIG. 2. As observed in FIG. 3, the memory controller 302 has improved self refresh control logic circuitry 309 that is able to generate a self refresh command to the memory device 302 that also specifies that the memory device is to perform periodic calibrations while the memory device is in the self refresh mode (self refresh with on-the-fly calibration). In an embodiment, more register space of the memory device includes an enable/disable field for periodic calibrations during self refresh mode. If the field is set when the memory device 302 receives a self refresh command, the memory device performs the period calibrations during the subsequent self refresh. When the memory controller 301 commands the memory device 302 to perform periodic calibrations when in self refresh mode, the memory controller 301 understands that it does not have to command the memory device 302 to perform a calibration as part of the transition out of self refresh.

For instance, the memory controller 302 commands the memory device 302 to exit self refresh, confirms the memory device's most recent calibration generated valid settings (by reading a mode register of the memory device) and, upon such confirmation, commands the memory device to latch the settings as the settings to be used during the memory device's upcoming active mode. Notably, the memory controller's calibration control logic circuitry 308 does not command the memory device 302 to perform a calibration as part of the transition to active mode from self refresh mode with periodic calibration.

Also as observed in FIG. 3, the memory device 302 includes self refresh control circuitry 306 having associated timer circuitry 307 that is responsible for periodically triggering the calibration controller 303 into action during self refresh so that the memory device 302 will periodically recalibrate its termination network and driver settings. The timer circuitry 307 can be implemented in various ways. According to a first embodiment, the timer circuitry 307 is coupled to phase locked loop (PLL) circuitry or delay locked loop (DLL) circuitry of the memory device 302 that determines an internal clock (e.g., a self refresh clock) of the memory device 302. A counter is coupled to the PLL/DLL circuitry to count the clock's cycles (e.g., the counter increments with each clock cycle). Each time the counter reaches a specific value, a recalibration is triggered and the counter value is reset.

According to a second embodiment, a counter associated with the self refresh controller 306 is used to trigger each recalibration action. Here, for example, the self refresh controller 306 includes one or more counters to count refreshes (e.g., per bank refresh counters that each separately count the refresh of a particular memory bank, a global refresh counter that increments after each memory bank has been refreshed, etc.). The timer circuitry 307 is coupled to the one or more counters and triggers recalibration activity when the one or more counters reach a specific one or more values. According to one embodiment, the calibration is triggered in between internal refreshes and any refreshes that are performed after the calibration do not commence until after the calibration is complete. According to another embodiment, the calibration is triggered in between internal refreshes and then executes concurrently with refreshes that are performed after the triggering of the calibration.

According to further embodiments, the termination network and driver settings that are determined during each self refresh calibration sequence are kept internally by the self refresh control circuitry 306. As such, these registers are updated with each new calibration that is performed during self refresh. Upon transition from self refresh mode to active, the settings that reside in the control circuitry's registers are latched into the into the memory device's formal network and driver setting control register space in response to an affirmative command by the memory controller 301 to do so and are used thereafter by the memory device 302 in active mode. I In a further embodiment of this approach, each time the memory device successfully performs a calibration, it sets a flag in its mode register space. The memory controller is then able to check the state of the flag to confirm that the most recent calibration was successful. If so, the memory controller 301 understands it can exit self refresh mode without issuing a calibration command to the memory device 302. If the memory device does not see the flag being affirmatively set, the memory controller 301 understands it should issue a calibration command as part of the transition from self refresh mode to active mode. This later scenario is possible if the entire self refresh time period is less than TD.

In further embodiments the TD time period may be configurable within the memory device. For example, mode register settings of the memory device may permit different TD settings within the memory device. Alternatively, the TD parameter may be hard designed into the memory device 302.

In various embodiments, the memory device may be further designed more autonomously that described above and need not be affirmatively commanded by the memory controller to enter self refresh mode. That is, the memory device may have its own internal logic that places the memory device into self refresh mode without being affirmatively told to do so by the memory controller. In this case, a mode register of the memory device may be set by the memory controller that the memory device is to periodically perform calibrations as described above during a self refresh mode that it enters on its own accord.

Note that the control circuitry 303, 306, 308, 309 can be implemented with various forms of logic circuitry such as custom designed hardwired logic circuitry (e.g., hardwired state machines, etc.), programmable logic circuitry (e.g., field programmable gate array (FPGA), programmable logic array (PLA), etc.), logic circuitry that executes some form of program code (e.g., embedded processor, embedded controller, etc.) or any combination of these.

Figure 4:
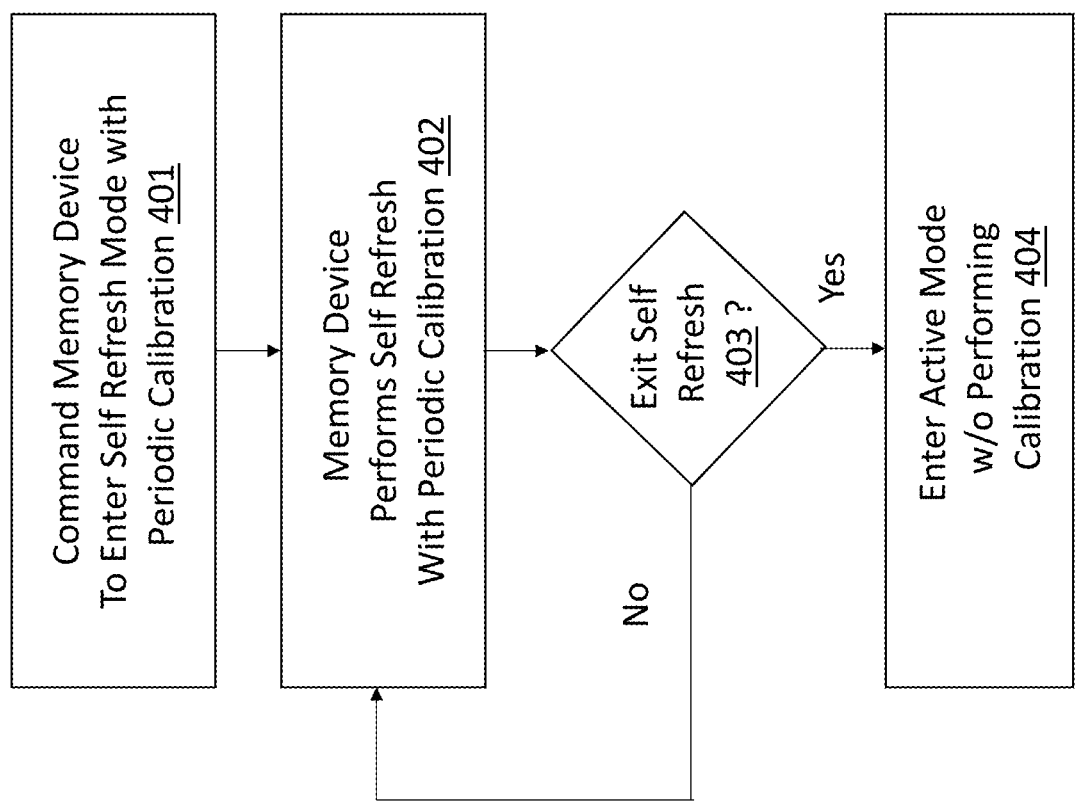
FIG. 4 shows a memory device self refreshing method.

FIG. 4 shows a method described above. The method includes sending a command to a memory device to enter self refresh mode with periodic calibrations 401. The memory device then self refreshes with periodic self refreshes being performed during the self refresh 402. Upon the memory device transitioning out of self refresh into an active mode 403, the memory device enters the active mode without performing a calibration 404.

Conceivably other embodiments/implementations may exist where multiple calibrations are performed by the memory device while the memory device is within self refresh mode but the calibrations are not performed periodically (e.g., they are performed at more random intervals).

The approaches described above may be specified by an industry standard such as a JEDEC industry standard specification (e.g., a DDR5 JEDEC industry standard specification).

Figure 5:
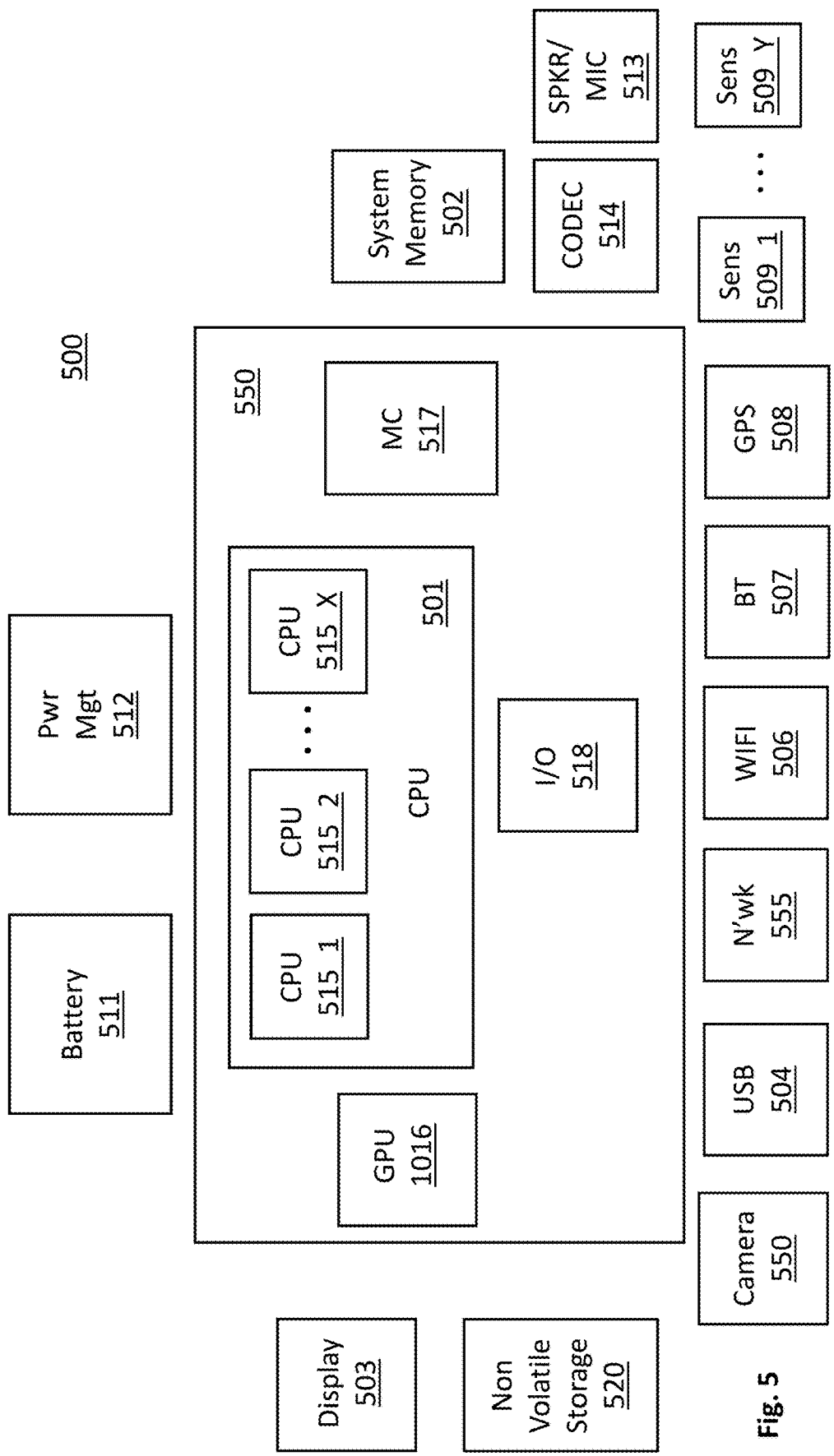
FIG. 5 shows a computing system.

FIG. 5 provides an exemplary depiction of a computing system 500 (e.g., a smartphone, a tablet computer, a laptop computer, a desktop computer, a server computer, etc.). As observed in FIG. 5, the basic computing system 500 may include a central processing unit 501 (which may include, e.g., a plurality of general purpose processing cores 515_1 through 515_X) and a main memory controller 517 disposed on a multi-core processor or applications processor, system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_Y, one or more cameras 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing unit 516 typically executes graphics intensive functions to, e.g., generate graphics information that is presented on the display 503. The memory control function 517 interfaces with the system memory 502 to write/read data to/from system memory 502. The memory controller 517 and system memory (or other memory controller and memory) may implement periodic refreshes of the memory device's resistive network terminations and driver settings during self refresh as described above. The power management control unit 512 generally controls the power consumption of the system 500.

Each of the touchscreen display 503, the communication interfaces 504-507, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The computing system also includes non-volatile storage 520 which may be the mass storage component of the system (e.g., a hard disk drive, a solid state drive, etc.).

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A memory controller, comprising:
   logic circuitry to command a memory device to perform calibrations of resistive network terminations and data drivers of the memory device while the memory device is within a self refresh mode, the logic circuitry is to set a flag within a mode register of the memory device that enables the performing of the calibrations while the memory device is within the self refresh mode.

2. The memory controller of claim 1 wherein the logic circuitry is to not send the memory device a command to calibrate the resistive network terminations and data drivers upon exit of the self refresh mode because the memory device has been commanded to perform the calibrations.

3. The memory controller of claim 2 wherein the logic circuitry is to send the memory device a first command to exit the self refresh mode and a second command to latch settings of the calibrations.

4. The memory controller of claim 1 wherein the logic circuitry is to check a register of the memory device that contains information that indicates whether a most recent one of the calibrations was successfully performed, and, if a most recent one of the calibrations was not successfully performed, the logic circuitry is to command the memory device to perform a calibration of the resistive network terminations and data drivers as part of the memory device's transition out of the self refresh mode even though the memory device was commanded to perform the calibrations during the self refresh mode.

5. A memory device, comprising:
   logic circuitry to perform calibrations of resistive network terminations and data drivers of the memory device while the memory device is within a self refresh mode, wherein the memory device includes mode register space that, when set, causes the memory device to perform the calibrations during the self refresh mode after the memory device receives a self refresh command.

6. The memory device of claim 5 wherein the logic circuitry is to cause the calibrations to be performed periodically.

7. The memory device of claim 6 wherein the logic circuitry comprises a counter.

8. The memory device of claim 7 wherein the counter is to count refreshes performed by the memory device.

9. The memory device of claim 7 wherein the counter is to count cycles of a clock of the memory device.

10. The memory device of claim 5 wherein the memory device includes a flag within mode register space of the memory device that indicates whether a most recent one of the calibrations has been successfully performed.

11. The memory device of claim 5 wherein the memory device is disposed on a dual in-line memory module (DIMM).

12. A computing system, comprising:
    a plurality of processing cores;
    a solid state drive;
    a system memory;
    a system memory controller coupled to the plurality of processing cores, the system memory controller comprising logic circuitry to command a memory device to perform calibrations of resistive network terminations and data drivers of the memory device while the memory device is within a self refresh mode, the logic circuitry is to set a flag within a mode register of the memory device that enables the performing of the calibrations while the memory device is within the self refresh mode.

13. The computing system of claim 12 wherein the logic circuitry is to not send the memory device a command to calibrate the resistive network terminations and data drivers upon exit of the self refresh mode because the memory device has been commanded to perform the calibrations.

14. The computing system of claim 13 wherein the logic circuitry is to send the memory device a first command to exit the self refresh mode and a second command to latch settings of the calibrations.

15. The computing system of claim 12 wherein the logic circuitry is to check a register of the memory device that contains information that indicates whether a most recent one of the calibrations was successfully performed, and, if a most recent one of the calibrations was not successfully performed, the logic circuitry is to command the memory device to perform a calibration of the resistive network terminations and data drivers as part of the memory device's transition out of the self refresh mode even though the memory device was commanded to perform the calibrations during the self refresh mode.

16. The computing system of claim 12 wherein the memory device is designed to comply with a JEDEC standard.

* * * * *